(12) United States Patent
Sakai

(10) Patent No.: US 12,323,148 B2
(45) Date of Patent: Jun. 3, 2025

(54) INTEGRATED CIRCUIT DEVICE

(71) Applicants:Kabushiki Kaisha Toshiba, Tokyo (JP); Toshiba Electronic Devices & Storage Corporation, Tokyo (JP)

(72) Inventor: Munenori Sakai, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 92 days.

(21) Appl. No.: 18/367,835

(22) Filed: Sep. 13, 2023

(65) Prior Publication Data

US 2024/0259001 A1    Aug. 1, 2024

(30) Foreign Application Priority Data

Feb. 1, 2023    (JP) .................. 2023-014048

(51) Int. Cl.
*H03K 3/012*    (2006.01)
*H03K 17/687*    (2006.01)

(52) U.S. Cl.
CPC .......... *H03K 3/012* (2013.01); *H03K 17/6871* (2013.01)

(58) Field of Classification Search
CPC ..................... H03K 3/012; H03K 17/6871
USPC ........ 327/365, 419, 427, 434, 564, 565, 566
See application file for complete search history.

(56) References Cited

U.S. PATENT DOCUMENTS

| 5,438,280 A * | 8/1995 | Sugawara ...... H03K 19/018521 327/143 |
| 7,683,687 B2 | 3/2010 | Kawashima et al. |
| 2019/0109589 A1* | 4/2019 | Kobayashi ........... H03K 5/2472 |
| 2021/0203320 A1* | 7/2021 | Kagimoto ...... H03K 19/018521 |

FOREIGN PATENT DOCUMENTS

| JP | 2002-198795 A2 | 7/2002 |
| JP | 2003-037490 A | 2/2003 |
| JP | 4004659 B2 | 11/2007 |
| JP | 2008-211707 A | 9/2008 |
| JP | 5567455 B2 | 8/2014 |

* cited by examiner

*Primary Examiner* — William Hernandez
(74) *Attorney, Agent, or Firm* — Kim & Stewart LLP

(57) ABSTRACT

In a device, a first transistor has a gate connected to an input. A first resistance is connected between one end of the first transistor and a first power supply line. A second resistance is connected between the other end of the first transistor and the second power supply line. A second transistor has a gate connected to a first node between the first transistor and the first resistance, and one end thereof is connected to the first power supply line. A current source is connected to the other end of the second transistor and the second power supply line. An inverter circuit has an input part connected to a second node between the second transistor and the current source, has an output part connected to an output, and outputs a voltage on any of the first power supply line or the second power supply line from the output.

16 Claims, 11 Drawing Sheets

INTEGRATED CIRCUIT DEVICE

CROSS REFERENCE TO RELATED APPLICATIONS

This application is based upon and claims the benefit of priority from the prior Japanese Patent Application No. 2023-014048, filed on Feb. 1, 2023, the entire contents of which are incorporated herein by reference.

FIELD

The embodiments of the present invention relate to an integrated circuit device.

BACKGROUND

With regard to an input circuit that inputs signals from outside to a semiconductor integrated circuit, lower power consumption has been demanded.

DETAILED DESCRIPTION

Figure 1:
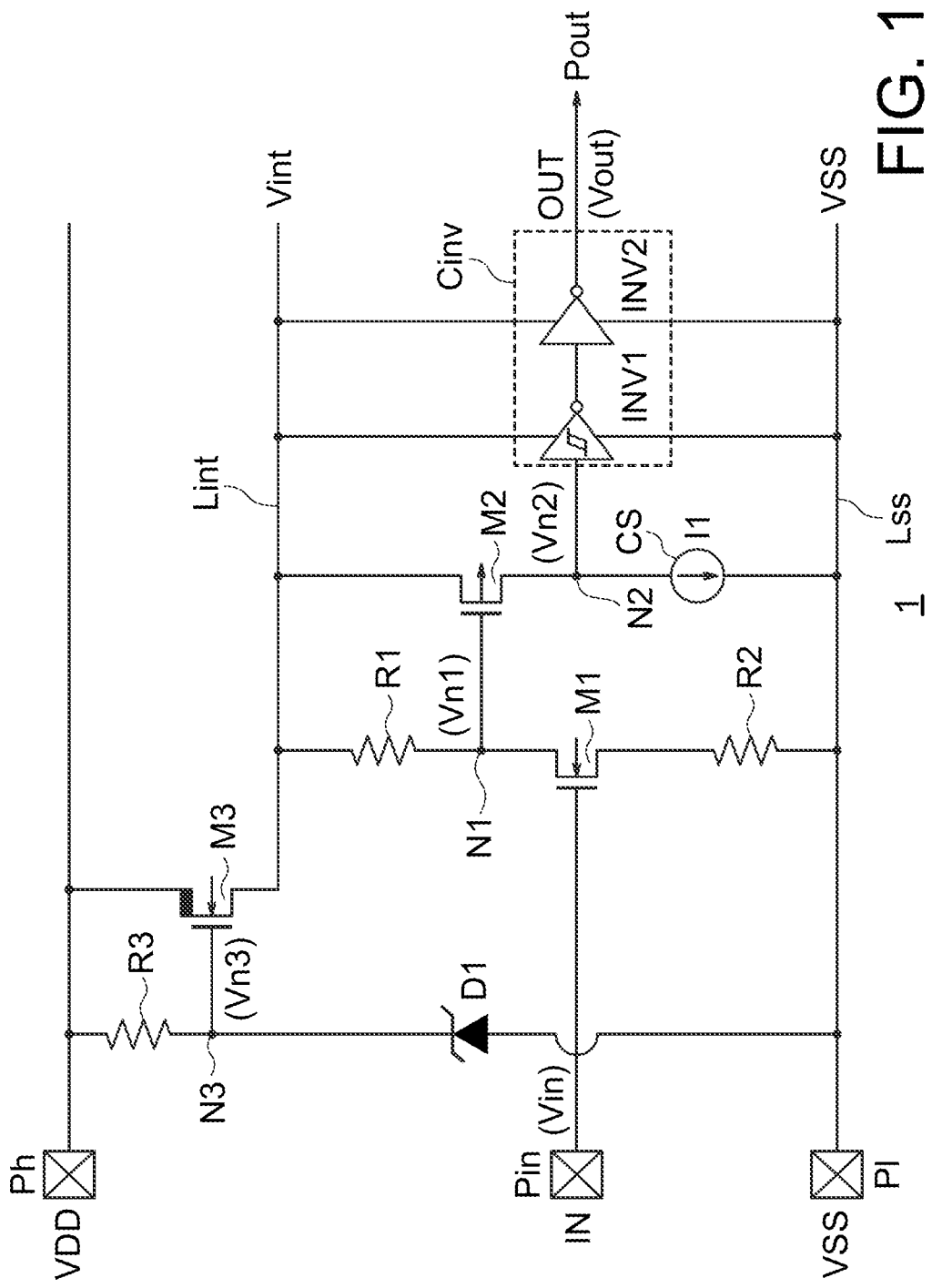
FIG. 1 is a circuit diagram illustrating an input circuit of an integrated circuit device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

An integrated circuit device according to the present embodiment comprises: an input terminal; an output terminal; a first power supply line; and a second power supply line configured to transmit a voltage lower than a voltage on the first power supply line. A first transistor has a gate electrically connected to the input terminal. A first resistance element is electrically connected between one end of the first transistor and the first power supply line. A second resistance element is electrically connected between the other end of the first transistor and the second power supply line. A second transistor has a gate electrically connected to a first node between the first transistor and the first resistance element, and one end thereof is electrically connected to the first power supply line. A current source is electrically connected between the other end of the second transistor and the second power supply line. An inverter circuit has an input part electrically connected to a second node between the second transistor and the current source, has an output part electrically connected to the output terminal, and is configured to output a voltage on any of the first power supply line or the second power supply line from the output terminal.

First Embodiment

FIG. 1 is a circuit diagram illustrating an input circuit 1 of an integrated circuit device according to a first embodiment.

The input circuit 1 includes an input terminal Pin, an output terminal Pout, a first power supply terminal Ph, a second power supply terminal Pl, a first power supply line Lint, a second power supply line Lss, a first transistor M1, a second transistor M2, a third transistor M3, a first resistance element R1, a second resistance element R2, a third resistance element R3, a constant current source CS, an inverter circuit Cinv, and a diode D1.

The first power supply terminal Ph receives a high power supply voltage VDD as a first power supply voltage. The second power supply terminal Pl receives a low power supply voltage VSS as a second power supply voltage.

The input terminal Pin receives a control signal from outside. The input voltage of the input terminal Pin is Vin. The output terminal Pout outputs a power supply voltage as any of a predetermined internal power supply voltage Vint or a predetermined power supply voltage VSS based on the control signal from outside received by the input terminal Pin. The output voltage of the output terminal Pout is Vout.

The input circuit 1 outputs an output signal OUT using any of the internal power supply voltage Vint or the power supply voltage VSS based on the logic of an input signal IN input to the input terminal Pin. Accordingly, the input circuit 1 can switch the output voltage Vout between the internal power supply voltage Vint (logical high: ON state) and the power supply voltage VSS (logical low: OFF state) based on the logic of the control signal from the input terminal Pin.

The first transistor M1 is an n-MOSFET (Metal Oxide Semiconductor Field Effect Transistor), for example. A gate of the first transistor M1 is connected to the input terminal Pin. A drain of the first transistor M1 is connected to the first power supply line Lint via the first resistance element R1. A source of the first transistor M1 is connected to the second power supply line Lss via the second resistance element R2. Here, "connected" means not only a state of being connected to another part in direct contact, but also a state of being electrically connected to another part via another element.

The first resistance element R1 is connected between the drain of the first transistor M1 and the first power supply line Lint.

The second resistance element R2 is connected between the source of the first transistor M1 and the second power supply line Lss.

The second transistor M2 is a p-MOSFET, for example. A gate of the second transistor M2 is connected to a first node N1 provided between the drain of the first transistor M1 and the first resistance element R1. The voltage of the first node N1 is Vn1. A source of the second transistor M2 is connected to the first power supply line Lint. A drain of the second transistor M2 is connected to the second power supply line Lss via the constant current source CS.

The constant current source CS is connected between the drain of the second transistor M2 and the second power supply line Lss and functions to pass a constant current I1 to the second transistor M2.

An input part of the inverter circuit Cinv is connected to a second node N2 provided between the second transistor M2 and the constant current source CS. An output part of the inverter circuit Cinv is connected to the output terminal Pout.

The inverter circuit Cinv includes a plurality of inverters INV1 and INV2 connected in series between the second node N2 and the output terminal Pout. The input of the former inverter INV1 is connected to the second node N2 and the output thereof is connected to the input of the subsequent inverter INV2. The voltage of the second node N2 is Vn2. The output of the inverter INV2 is connected to the output terminal Pout. While the inverter circuit Cinv is constituted by two serially connected inverters, it may be constituted by three or more inverters.

Among the plurality of inverters INV1 and INV2, the former inverter INV1 connected to the second node N2 is a Schmitt inverter, for example. Accordingly, the operation of the inverter circuit Cinv can be stable.

Power is respectively fed to the inverters INV1 and INV2 between the first power supply line Lint and the second power supply line Lss. Therefore, the inverter INV1 outputs an inversion signal having a logic according to the voltage level of the second node N2 as the internal power supply voltage Vint or the second power supply voltage VSS. The inverter INV2 outputs an inversion signal having a logic according to the voltage level of the output of the inverter INV1 as the internal power supply voltage Vint or the second power supply voltage VSS.

The third resistance element R3 and the diode D1 are connected to each other in series between the first power supply terminal Ph and the second power supply terminal Pl. The diode D1 is a Zener diode, for example. The anode of the diode D1 is connected to the second power supply line Lss. The cathode of the diode D1 is connected to a third node N3. The voltage of the third node N3 is Vn3. The diode D1 is provided to stabilize the voltage of the third node N3 with respect to voltage fluctuations of the power supply voltages VDD and VSS. The internal power supply voltage Vint is stabilized with respect to voltage fluctuations of the power supply voltages VDD and VSS by stabilizing the voltage of the third node N3.

The third transistor M3 is an n-DMOSFET (Double-Diffused MOSFET), for example. A gate of the third transistor M3 is connected to the third node N3 provided between the third resistance element R3 and the diode D1. A drain of the third transistor M3 is connected to the first power supply terminal Ph. A source of the third transistor M3 is connected to the first power supply line Lint. By using a DMOSFET as the third transistor M3, even when an overvoltage is applied on the first power supply terminal Ph on the drain side, the third transistor M3 is hardly broken down.

Operations of the input circuit 1 are described next.

Figure 2A:
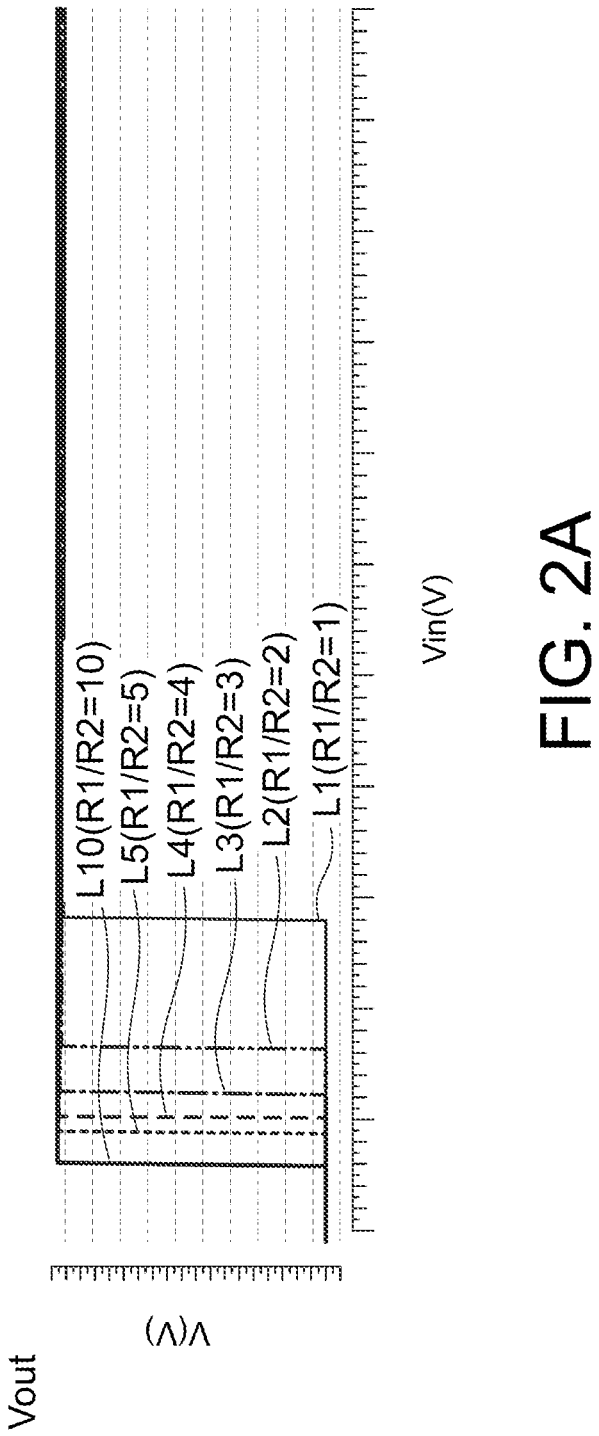
FIG. 2A is a graph illustrating an operation example of the input circuit according to the first embodiment.
Figure 2B:
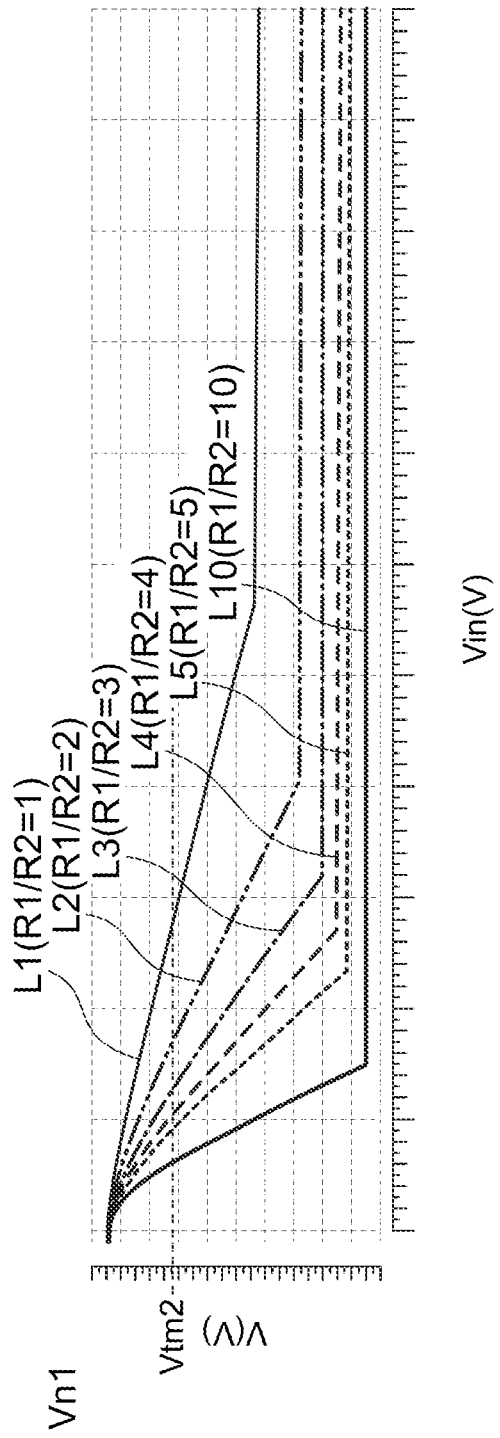
FIG. 2B is another graph illustrating an operation example of the input circuit according to the first embodiment.
Figure 2C:
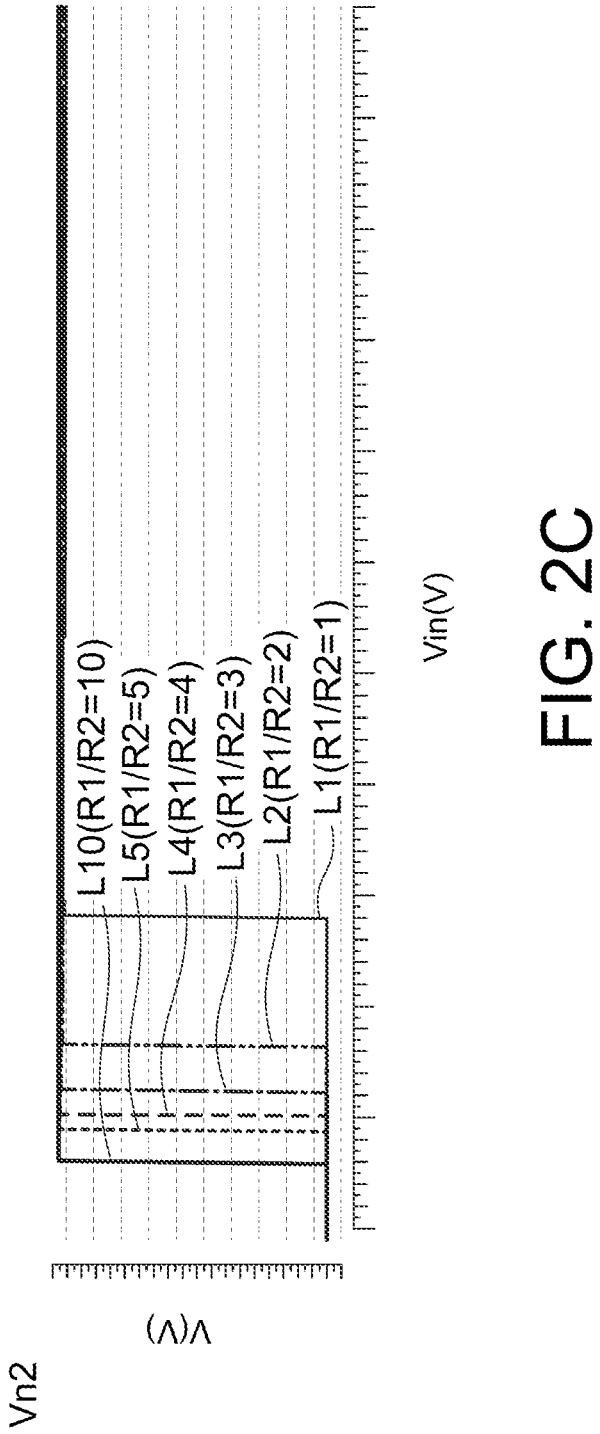
FIG. 2C is still another graph illustrating an operation example of the input circuit according to the first embodiment.
Figure 2D:
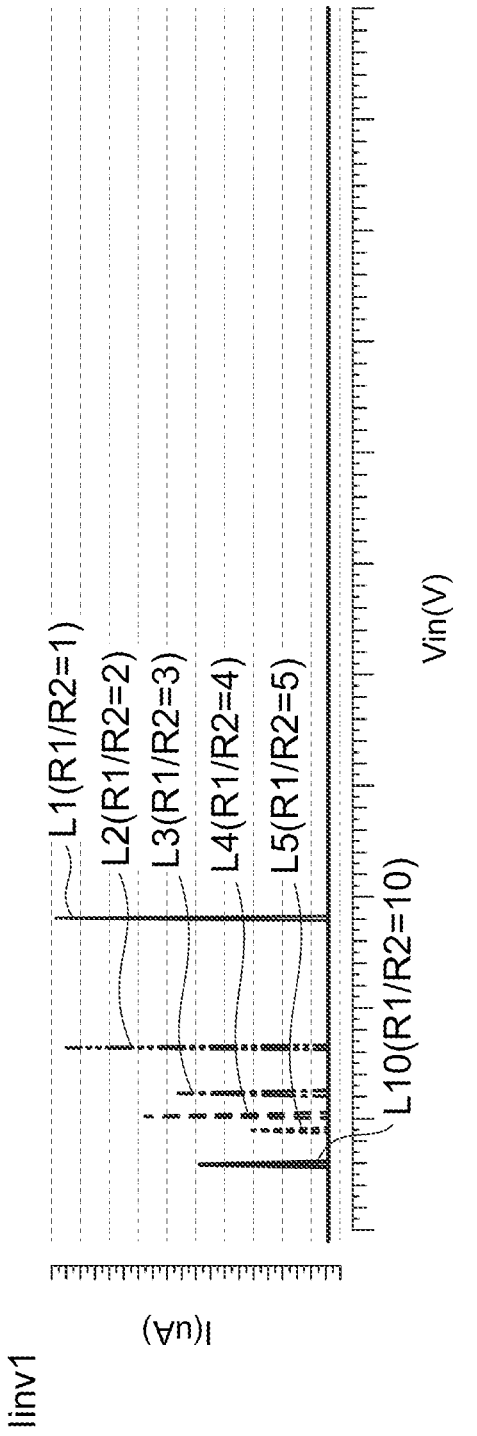
FIG. 2D is still another graph illustrating an operation example of the input circuit according to the first embodiment.

FIGS. 2A to 2D are graphs respectively illustrating an operation example of the input circuit 1 according to the first embodiment. The horizontal axis in each of FIGS. 2A to 2D represents the input voltage Vin input from the input terminal Pin. The vertical axis in FIG. 2A represents the output voltage Vout output from the output terminal Pout. The vertical axis in FIG. 2B represents the voltage Vn1 of the first node N1. The vertical axis in FIG. 2C represents the voltage Vn2 of the second node N2. The vertical axis in FIG. 2D represents a current Iinv1 supplied from the first power supply line Lint to the inverter INV1.

With reference to FIG. 1, first, when the high power supply voltage VDD is applied, the gate voltage (Vn3) of the third transistor M3 is set by the third resistance element R3 and the diode D1. With this setting, the third transistor M3 is in a conduction state and the internal power supply voltage Vint is on the first power supply line Lint. In this case, even when the high power supply voltage VDD is fluctuated, the third resistance element R3 and the diode D1 do not largely fluctuate the voltage Vn3 and stabilize it. With this configuration, the conduction state of the third transistor M3 is stabilized and the internal power supply voltage Vint is stabilized with respect to voltage fluctuations of the power supply voltage VDD.

When the input voltage Vin is a low-level voltage (logical low), the first transistor M1 in FIG. 1 is in a non-conduction state. Therefore, the voltage Vn1 is charged via the first resistance element R1 and by the internal power supply voltage Vint to be a high-level voltage of the internal power supply voltage Vint. That is, as indicated by the initial values in FIG. 2B, the voltage Vn1 is a high-level voltage.

Accordingly, the second transistor M2 in FIG. 1 is in a non-conduction state. Therefore, the voltage Vn2 is decreased by the constant current source CS to be a low-level voltage of the power supply voltage VSS. That is, as indicated by the initial values in FIG. 2C, the voltage Vn2 is a low-level voltage. In this manner, the second transistor M2 and the constant current source CS transmit a signal having the same logic as the logic of the input signal IN of the input voltage Vin to the inverter circuit Cinv.

Further, since the input voltage (Vn2) of the inverter circuit Cinv in FIG. 1 becomes a low-level voltage, as indicated by the initial values in FIG. 2A, the inverter circuit Cinv outputs a low-level voltage (logical low) as the output voltage Vout. In this manner, when the input signal IN is logical low, the output signal OUT is also outputted as logical low.

Next, a case where the input voltage Vin is switched from a low-level voltage (logical low) to a high-level voltage (logical high) is described.

When the input voltage Vin becomes a high-level voltage (logical high), the first transistor M1 in FIG. 1 is switched from a non-conduction state to a conduction state. Accordingly, the voltage Vn1 becomes a voltage caused by dividing a voltage difference between the internal power supply voltage Vint and the power supply voltage VSS by the resistance elements R1 and R2 (hereinafter, this voltage may be referred to as "voltage-divided value"). Further, the slope of change (voltage response characteristics) in the voltage Vn1 as it changes from the internal power supply voltage Vint to the voltage-divided value becomes gradual. This slope of change in the voltage Vn1 is changed with a ratio (R1/R2) between the resistance elements R1 and R2.

In FIGS. 2A to 2D, lines L1, L2, L3, L4, L5, and L10 represent the output voltage Vout, the voltage Vn1 of the first node N1, the voltage Vn2 of the second node N2, and the current Iinv1 supplied to the inverter INV1 when the resistance ratio R1/R2 is 1, 2, 3, 4, 5, and 10, respectively.

For example, as represented with the line L1 in FIG. 2B, when the resistance ratio R1/R2 is 1, the slope of change in the voltage Vn1 is small and is very gradual. As the resistance ratio R1/R2 is made larger as it is changed to be 2, 3, 4, and 5, as represented with the lines L2, L3, L4, and L5 in FIG. 2B, the slope of change in the voltage Vn1 becomes increasingly larger. As represented with the line L10 in FIG. 2B, when the resistance ratio R1/R2 is 10, the slope of change in the voltage Vn1 is relatively steep.

Assuming that the threshold voltage of the second transistor M2 is Vtm2, as illustrated in FIG. 2B, when the voltage Vn1 is lower than the threshold voltage Vtm2, the second transistor M2 in FIG. 1 is switched from a non-conduction state to a conduction state. Any resistance element is not interposed between the first power supply line Lint and the second transistor M2 and only the constant current I1 flows from the second node N2 to the second power supply voltage VSS. Therefore, as the second transistor M2 enters a conduction state, the second node N2 is charged from the first power supply line Lint in a short time, and the voltage Vn2 rises steeply from a low-level voltage to a high-level voltage in a short time as illustrated in FIG. 2C.

In this manner, since the input voltage (Vn2) of the inverter circuit Cinv in FIG. 1 becomes a high-level voltage, as illustrated in FIG. 2A, the inverter circuit Cinv switches the output voltage Vout from a low-level voltage (logical low) to a high-level voltage (logical high). When the input signal IN is switched from logical low to logical high in this way, the output signal OUT is also switched from logical low to logical high. With this process, the input circuit 1 can transmit the input signal IN to internal circuits as the output signal OUT of any voltage.

Here, in the input circuit 1 according to the present embodiment, when the input signal IN is switched from logical low to logical high, as illustrated in FIG. 2B, the slope of change in the voltage Vn1 of the first node N1 changes according to the resistance ratio R1/R2 and it is gradual.

However, in the present embodiment, the second transistor M2 and the constant current source CS are interposed between the first transistor M1 and the inverter circuit Cinv. Therefore, the second transistor M2 enters a conduction state when the voltage Vn1 is below the threshold voltage Vtm2, and the second transistor M2 and the constant current source CS cause the voltage Vn2 of the second node N2 to rise steeply. As a result, the gradual slope of the voltage Vn1 illustrated in FIG. 2B becomes a steep slope as that of the voltage Vn2 illustrated in FIG. 2C. By inputting the voltage Vn2 with such a steep slope to the inverter circuit Cinv, the flow-through current Iinv1 in the inverter circuit Cinv is decreased. For example, as illustrated in FIG. 2D, the flow-through current Iinv1 that flows from the first power supply line Lint to the inverter INV1 is generated only for a short time at a timing where the second transistor M2 is switched from a non-conduction state to a conduction state. While the flow-through current Iinv1 changes to some extent according to the resistance ratio R1/R2, the change is very small.

Figure 3:
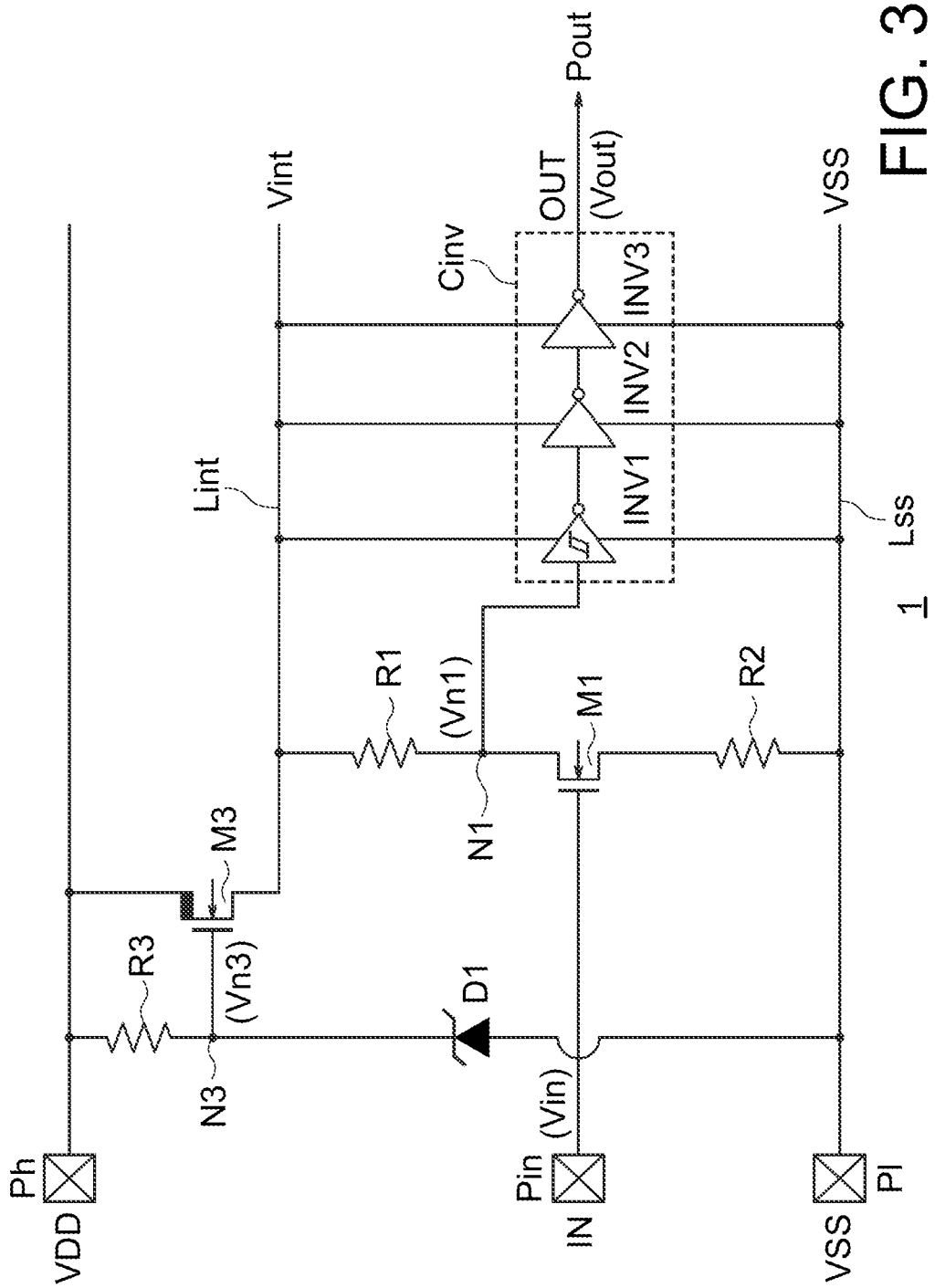
FIG. 3 is a circuit diagram illustrating an input circuit according to a comparative example.

Meanwhile, for example, as illustrated in FIG. 3, there is assumed a comparative example where the second transistor M2 and the constant current source CS illustrated in FIG. 1 are omitted and the first node N1 is connected to the input of the inverter circuit Cinv.

FIG. 3 is a circuit diagram illustrating an input circuit according to the comparative example. In this comparative example, the second transistor M2 and the constant current source CS are omitted. Therefore, the voltage Vn1 of the first node N1 illustrated in FIG. 2B is directly input to the inverter circuit Cinv. Here, in order to set the logic of the output signal OUT the same as that of the output signal OUT in FIG. 1, the inverter circuit Cinv is constituted by serially connected three inverters INV1 to INV3.

Figure 4A:
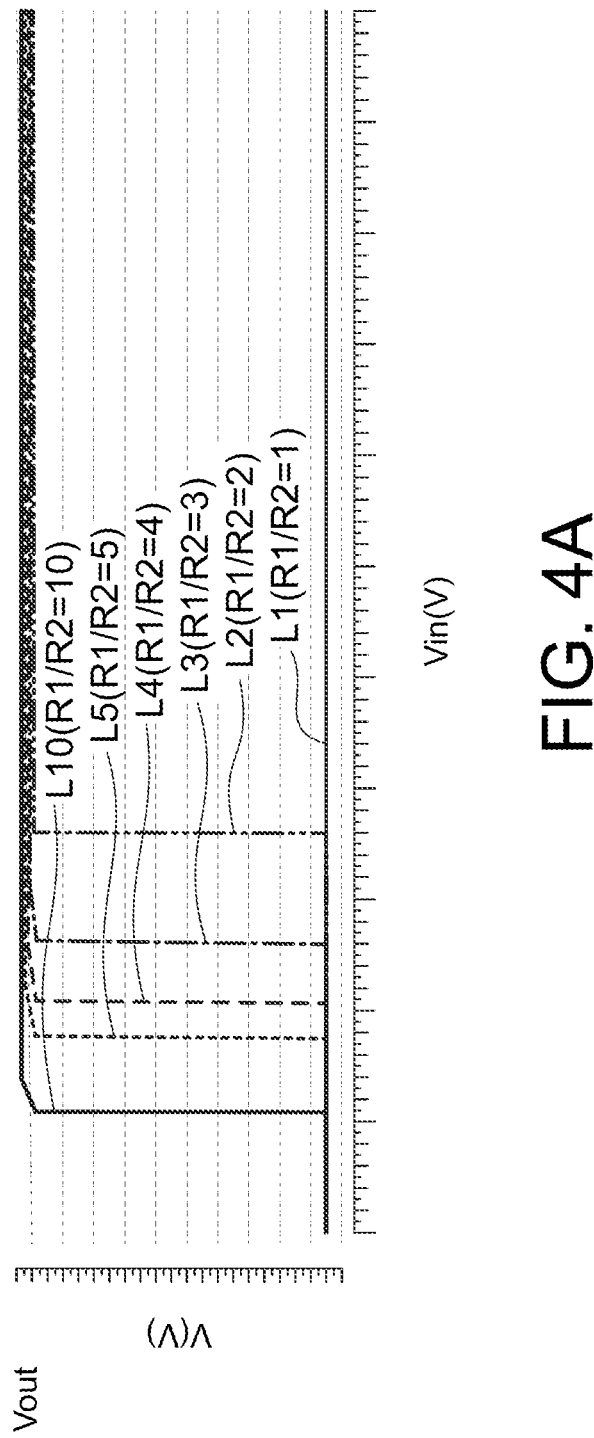
FIG. 4A is a graph illustrating operations of the input circuit according to the comparative example.
Figure 4B:
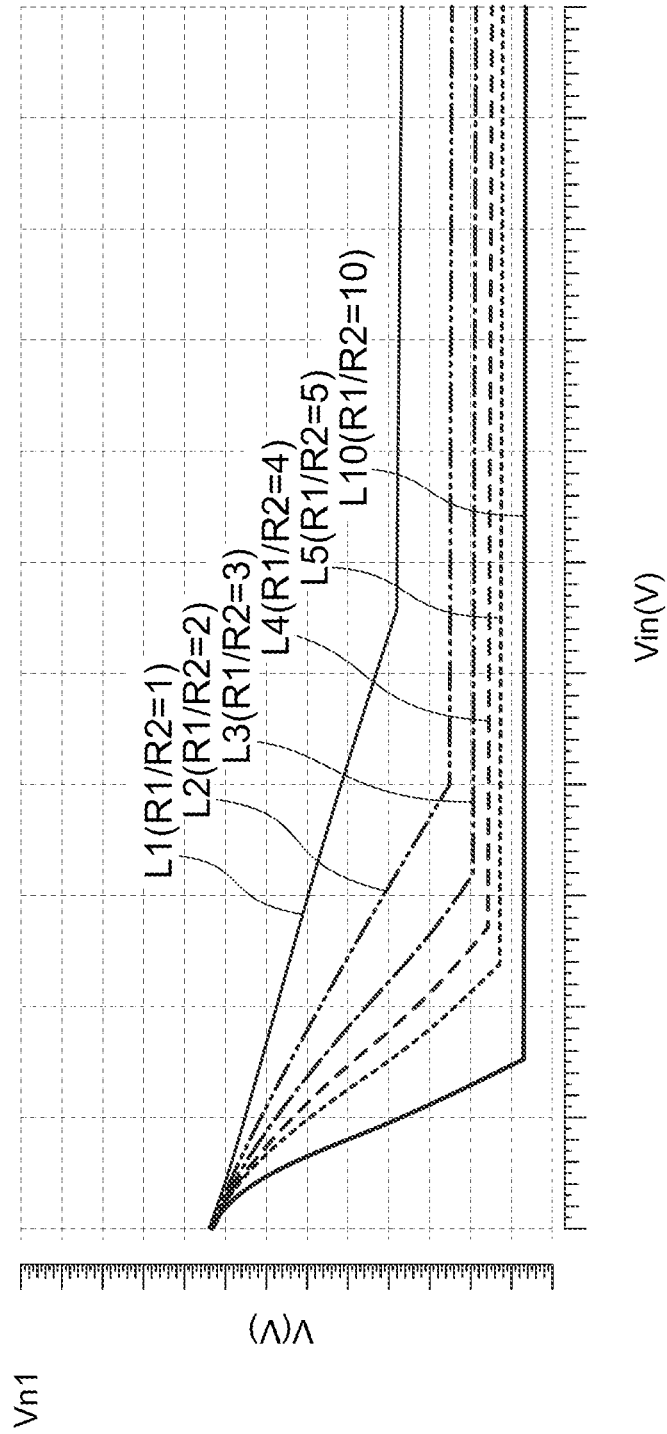
FIG. 4B is another graph illustrating operations of the input circuit according to the comparative example.
Figure 4C:
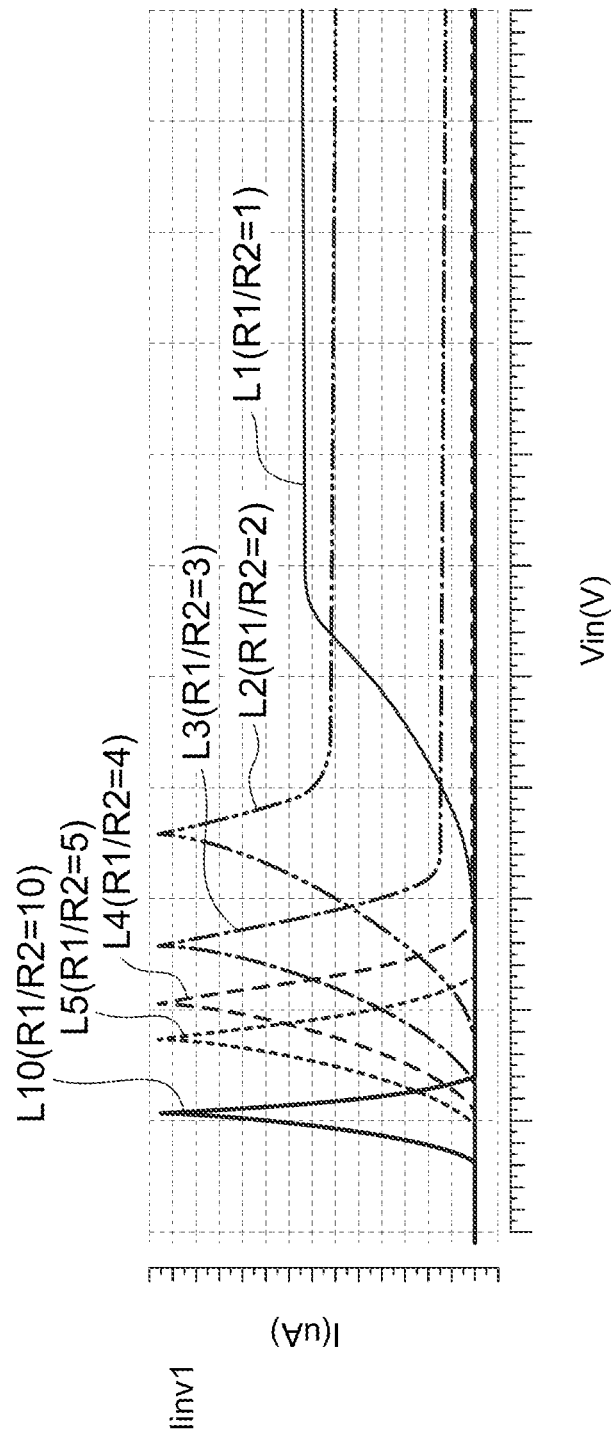
FIG. 4C is still another graph illustrating operations of the input circuit according to the comparative example.

FIGS. 4A to 4C are graphs respectively illustrating operations of the input circuit according to the comparative example. The horizontal axis in each of FIGS. 4A to 4C represents the input voltage Vin input from the input terminal Pin. The vertical axis in FIG. 4A represents the output voltage Vout. The vertical axis in FIG. 4B represents the voltage Vn1 of the first node N1. The vertical axis in FIG. 4C represents the current Iinv1 supplied from the first power supply line Lint to the inverter INV1. The graph of FIG. 4B may be the same as that of FIG. 2B.

First, the initial state in the comparative example may be the same as that in the first embodiment. Therefore, the first power supply line Lint is charged to the internal power supply voltage Vint.

When the input voltage Vin is a low-level voltage (logical low), the first transistor M1 in FIG. 3 is in a non-conduction state. Therefore, the voltage Vn1 is charged via the first resistance element R1 and by the internal power supply voltage Vint to be a high-level voltage of the internal power supply voltage Vint. That is, as indicated by the initial values in FIG. 4B, the voltage Vn1 is a high-level voltage.

Accordingly, since the input voltage (Vn1) of the inverter circuit Cinv in FIG. 3 becomes a high-level voltage, as indicated by the initial values in FIG. 4A, the inverter circuit Cinv outputs a low-level voltage (logical low) as the output voltage Vout. In this manner, when the input signal IN is logical low, the output signal OUT is also outputted as logical low.

Next, a case where the input voltage Vin is switched from a low-level voltage (logical low) to a high-level voltage (logical high) is described.

When the input voltage Vin becomes a high-level voltage (logical high), the first transistor M1 in FIG. 3 is switched from a non-conduction state to a conduction state. Accordingly, the voltage Vn1 becomes a voltage-divided value caused by dividing a voltage difference between the internal power supply voltage Vint and the power supply voltage VSS by the resistance elements R1 and R2. Further, the slope of change (voltage response characteristics) in the voltage Vn1 as it changes from the internal power supply voltage Vint to the voltage-divided value becomes gradual. For example, as illustrated in FIG. 4B, while slopes of change are varied according to the resistance ratio R1/R2 with reference to the lines L1 to L10, each slope of change in the voltage Vn1 is small and gradual.

When the slope of change in the voltage Vn1 becomes gradual, the slope of change in the input voltage (Vn1) of the inverter circuit Cinv in FIG. 3 also becomes gradual. In this case, the voltage range (the range of Vin) of the input signal IN in which the input voltage (Vn1) of the inverter circuit Cinv becomes an intermediate potential is broadened. Accordingly, the flow-through current Iinv1 flowing in the inverter circuit Cinv is increased as illustrated in FIG. 4C.

For example, as illustrated in FIG. 4B, on the line L1, the slope of change in the voltage Vn1 is very gradual and the inverter INV1 is not inverted as illustrated in FIG. 4A. In this case, as illustrated in FIG. 4C, the flow-through current Iinv1 keeps flowing while the input voltage (Vn1) of the inverter circuit Cinv remains to be an intermediate potential. On the lines L2 to L10, while the inverter INV1 is inverted as illustrated in FIG. 4A, the slope of change in the voltage Vn1 is still gradual as illustrated in FIG. 4B. In this case, as illustrated in FIG. 4C, the flow-through current Iinv1 is also relatively large.

Meanwhile, in the present embodiment, as illustrated in FIG. 1, the second transistor M2 and the constant current source CS are interposed between the first transistor M1 and the inverter circuit Cinv. With this configuration, as illustrated in FIG. 2C, the second transistor M2 and the constant current source CS cause the voltage Vn2 of the second node N2 to rise steeply. As a result, the gradual slope of the voltage Vn1 illustrated in FIG. 2B is input to the inverter circuit Cinv as the steep slope of the voltage Vn2 illustrated in FIG. 2C. Accordingly, as illustrated in FIG. 2D, on each of the lines L1 to L10 (in each resistance ratio R1/R2), the flow-through current Iinv1 in the inverter circuit Cinv is decreased. As the flow-through current Iinv1 is decreased, the entire power consumption of the input circuit 1 can be lowered.

Second Embodiment

Figure 5:
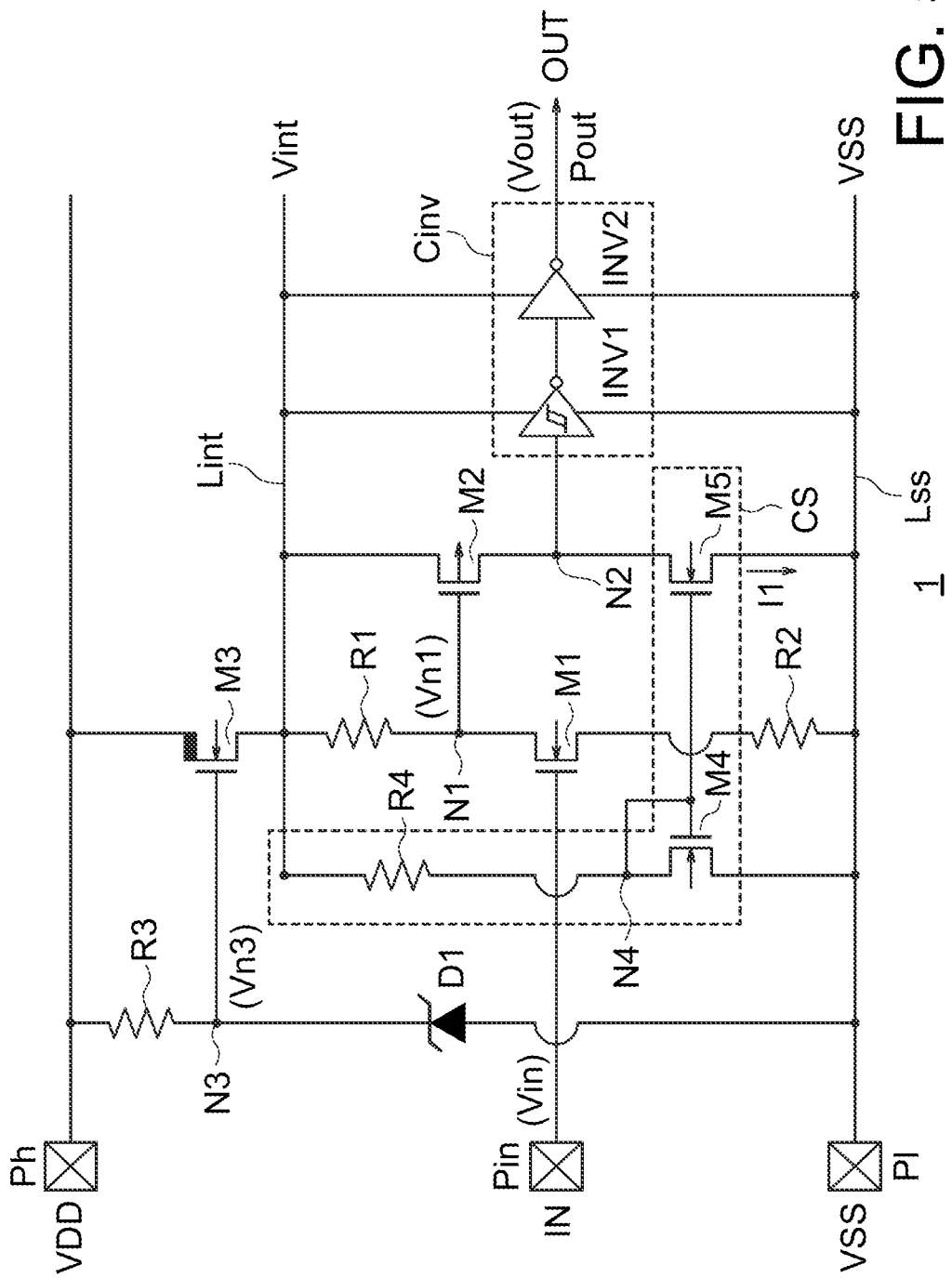
FIG. 5 is a circuit diagram illustrating an input circuit of an integrated circuit device according to a second embodiment.

FIG. 5 is a circuit diagram illustrating the input circuit 1 of an integrated circuit device according to a second embodiment. In the second embodiment, a specific example of internal circuits in the constant current source CS is described.

The constant current source CS includes a fourth resistance element R4, a fourth transistor M4, and a fifth transistor M5.

The fourth resistance element R4 and the fourth transistor M4 are connected to each other in series between the first power supply line Lint and the second power supply line Lss. The fourth resistance element R4 is connected between the first power supply line Lint and a drain and a gate of the fourth transistor M4. The fourth transistor M4 is an n-MOSFET, for example. The drain and the gate of the fourth transistor M4 are connected to the first power supply line Lint via the fourth resistance element R4, and a source of the fourth transistor M4 is connected to the second power supply line Lss.

A gate of the fifth transistor M5 is connected to a fourth node N4 (the gates of the fourth and fifth transistors M4 and M5) between the fourth transistor M4 and the fourth resistance element R4. A drain of the fifth transistor M5 is connected to the second node N2. A source of the fifth transistor M5 is connected to the second power supply line Lss.

The fourth and fifth transistors M4 and M5 constitute a current mirror circuit. The fourth resistance element R4 and the fourth transistor M4 receive the internal power supply voltage Vint from the first power supply line Lint and pass a constant current to the second power supply line Lss. The fifth transistor M5 that constitutes a current mirror circuit with the fourth transistor M4 passes a constant current corresponding to the current flowing in the fourth transistor M4 from the second node N2 to the second power supply line Lss. In this manner, the constant current source CS is configured to pass the constant current I1.

As described above, in the second embodiment, the constant current source CS is configured to pass the constant current I1 generated by the current mirror circuit (M4 and M5) based on the current from the first power supply line Lint from the second node N2. Even with the configuration in the second embodiment, effects identical to those of the first embodiment can be achieved.

Third Embodiment

Figure 6:
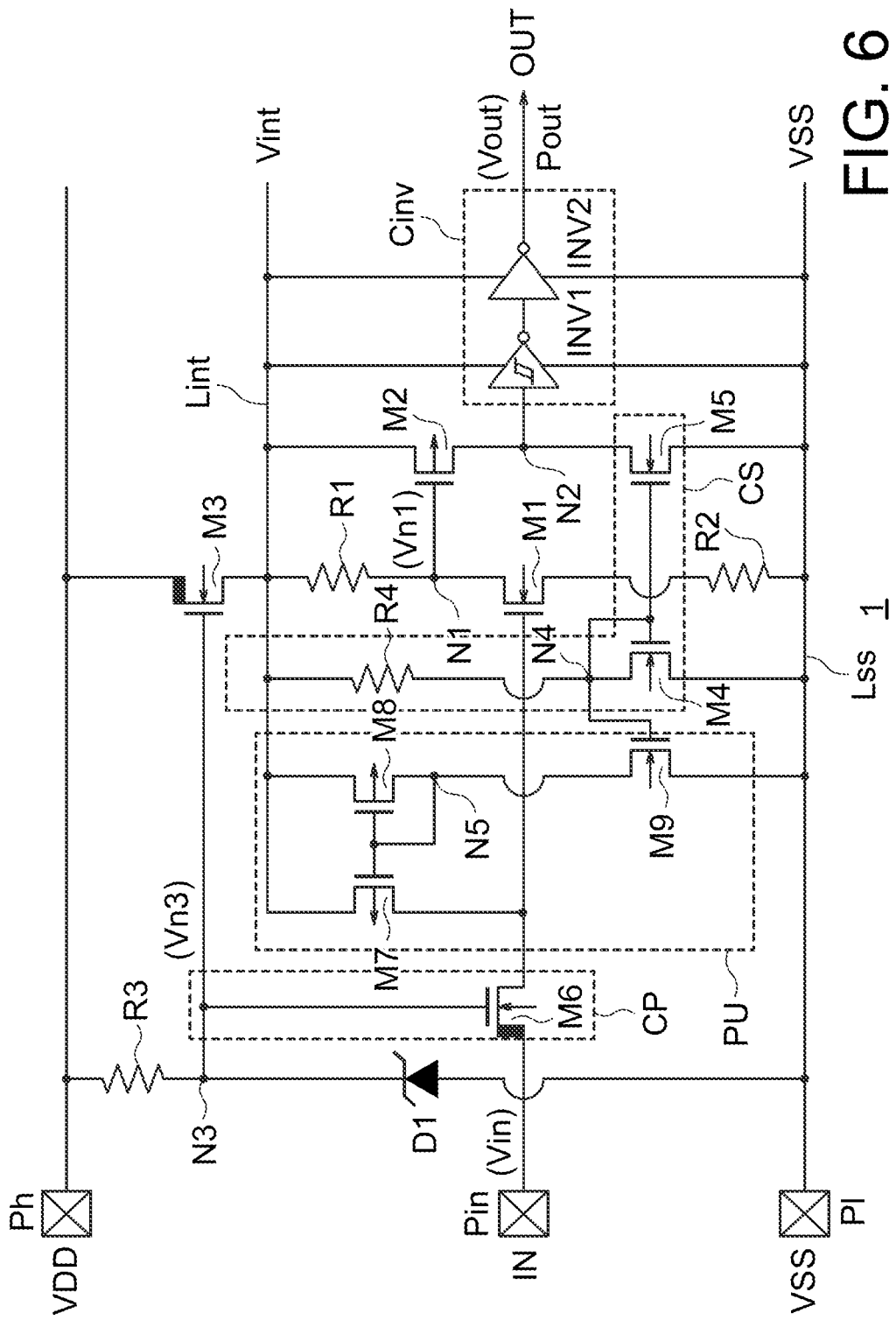
FIG. 6 is a circuit diagram illustrating an input circuit of an integrated circuit device according to a third embodiment.

FIG. 6 is a circuit diagram illustrating the input circuit 1 of an integrated circuit device according to a third embodiment. The input circuit 1 according to the third embodiment further includes a protection circuit CP and a pull-up circuit PU.

The protection circuit CP includes a sixth transistor M6. A gate of the sixth transistor M6 is connected to the third node N3 with the gate of the third transistor M3. A drain of the sixth transistor M6 is connected to the input terminal Pin. The source of the sixth transistor M6 is connected to the gate of the first transistor M1. Therefore, the sixth transistor M6 is connected between the input terminal Pin and the gate of the first transistor M1. The sixth transistor M6 is an n-DMOSFET, for example. By using a DMOSFET as the sixth transistor M6, even when an overvoltage is applied on the input terminal Pin on the drain side, the sixth transistor M6 is hardly broken down.

The sixth transistor M6 receives the voltage Vn3 of the third node N3 with the third transistor M3. Therefore, when the voltage Vn3 is caused to rise by the power supply voltage VDD, the sixth transistor M6 is in a conduction state similarly to the third transistor M3.

Assuming that the threshold voltage of the sixth transistor M6 is Vtm6, even when an overvoltage exceeding a voltage Vn3-Vtm6 is applied on the input terminal Pin, the gate-source voltage of the sixth transistor M6 does not change, and the current flowing between the drain and the source of the sixth transistor M6 can be suppressed. Accordingly, even when an overvoltage is applied on the input terminal Pin, internal circuits (such as the first transistor M1 and the pull-up circuit PU) provided in the downstream with respect to the sixth transistor M6 can be protected.

The pull-up circuit PU includes seventh to ninth transistors M7 to M9. A gate of the seventh transistor M7 is connected to a drain of the ninth transistor M9 with a drain and a gate of the eighth transistor M8. A source of the seventh transistor M7 is connected to the first power supply line Lint. A drain of the seventh transistor M7 is connected to the gate of the first transistor M1. That is, the seventh transistor M7 is connected between the first power supply line Lint and the gate of the first transistor M1. The seventh transistor M7 is a p-MOSFET, for example.

The gate of the eighth transistor M8 is connected to the drain of the ninth transistor M9 (the fifth node N5) with the gate of the seventh transistor M7 and the drain of the eighth transistor M8. A source of the eighth transistor M8 is connected to the first power supply line Lint with the source of the seventh transistor M7. The eighth transistor M8 is a p-MOSFET, for example.

A gate of the ninth transistor M9 is connected to the gates of the fourth and fifth transistors M4 and M5 (the fourth node N4). The drain of the ninth transistor M9 is connected to the gate of the seventh transistor M7 and the gate and the drain of the eighth transistor M8 (the fifth node N5). A source of the ninth transistor M9 is connected to the second power supply line Lss. Therefore, the ninth transistor M9 is connected between the fifth node N5 and the second power supply line Lss. The ninth transistor M9 is an n-MOSFET, for example.

The ninth transistor M9 constitutes a current mirror circuit with the fourth and fifth transistors M4 and M5 and passes a constant current corresponding to the current flowing in the fourth transistor M4 from the fifth node N5 to the second power supply line Lss.

Meanwhile, the seventh and eighth transistors M7 and M8 constitute a current mirror circuit. The seventh transistor M7 passes a constant current corresponding to the current flowing in the eighth transistor M8. Accordingly, the seventh transistor M7 charges the gate of the first transistor M1 from the first power supply line Lint, thereby pulling up the gate voltage of the first transistor M1.

With this configuration, even when the input terminal Pin is open and is not receiving any control signal, the pull-up circuit PU can pull up the gate voltage of the first transistor M1 to a high-level voltage corresponding to the internal power supply voltage Vint. Accordingly, similarly to a case where the input signal IN is maintaining to be logical high, the first transistor M1 maintains a conduction state and the output signal OUT maintains to be logical high. As a result, even when the input terminal Pin is open, internal circuits (not illustrated) receiving the output signal OUT can maintain a driving state.

Further, the pull-up circuit PU is constituted by a current mirror circuit formed of the seventh and eighth transistors M7 and M8. Accordingly, a current flowing in the gate of the first transistor M1 via the seventh transistor M7 can be suppressed.

For example, if the pull-up circuit PU is constituted by a pull-up resistor (not illustrated) connected between the third node N3 and the gate of the first transistor M1, the resistance value of the pull-up resistor needs to be risen in order to decrease the current flowing from the first power supply line Lint to the gate of the first transistor M1. In this case, the element area of the pull-up resistor is inevitably increased.

Meanwhile, in the third embodiment, as long as the size ratio between the seventh and eighth transistors M7 and M8 (the mirror ratio of a current mirror circuit) is adjusted, the current flowing from the first power supply line Lint to the gate of the first transistor M1 can be suppressed without increasing a layout area.

Further, when the pull-up circuit PU is constituted by the pull-up resistor described above, there is a risk that an overvoltage of the input terminal Pin is transmitted to internal circuits via a pull-up resistor element to break down the internal circuits.

Meanwhile, in the third embodiment, the pull-up circuit PU is constituted by the seventh and eighth transistors M7 and M8 and the protection circuit CP constituted by the sixth transistor M6 is provided. Therefore, in the third embodiment, even when an overvoltage is applied to the input terminal Pin, internal circuits can be protected.

The rest of the configuration in the third embodiment may be identical to the corresponding configuration of the first or second embodiment. Therefore, the third embodiment can achieve effects identical to those of the first or second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An integrated circuit device comprising:
an input terminal;
an output terminal;
a first power supply line;
a second power supply line configured to transmit a voltage lower than a voltage on the first power supply line;
a first transistor having a gate electrically connected to the input terminal;
a first resistance element electrically connected between one end of the first transistor and the first power supply line;
a second resistance element electrically connected between the other end of the first transistor and the second power supply line;
a second transistor having a gate electrically connected to a first node between the first transistor and the first resistance element, and one end thereof electrically connected to the first power supply line;
a current source electrically connected between the other end of the second transistor and the second power supply line; and
an inverter circuit having an input part electrically connected to a second node between the second transistor and the current source, having an output part electrically connected to the output terminal, and configured to output a voltage on any of the first power supply line or the second power supply line from the output terminal.

2. The device of claim 1, further comprising:
a third resistance element and a diode connected in series between a first power supply terminal receiving a first power supply voltage and a second power supply terminal receiving a second power supply voltage; and
a third transistor having a gate electrically connected to a third node between the third resistance element and the diode, and electrically connected between the first power supply terminal and the first power supply line.

3. The device of claim 2, further comprising a sixth transistor having a gate electrically connected to the third node, and electrically connected between the input terminal and the gate of the first transistor.

4. The device of claim 3, wherein the sixth transistor is a double-diffused MOSFET.

5. The device of claim 3, wherein
each of the first, third, and sixth transistors is an n-type transistor, and
the second transistor is a p-type transistor.

6. The device of claim 2, wherein the third transistor is a double-diffused MOSFET (Metal Oxide Semiconductor Field Effect Transistor).

7. The device of claim 2, wherein
each of the first and third transistors is an n-type transistor, and
the second transistor is a p-type transistor.

8. The device of claim 2, wherein the diode is a Zener diode which has an anode electrically connected to the second power supply line and a cathode thereof electrically connected to the third node.

9. The device of claim 1, wherein
the current source comprises:
a fourth resistance element and a fourth transistor connected in series between the first power supply line and the second power supply line; and
a fifth transistor having a gate electrically connected to a fourth node between the fourth transistor and the fourth resistance element and to a gate of the fourth transistor, and electrically connected between the second node and the second power supply line.

10. The device of claim 9, further comprising:
a seventh transistor electrically connected between the gate of the first transistor and the first power supply line;

an eighth transistor having one end electrically connected to the first power supply line, and the other end and a gate thereof electrically connected to a gate of the seventh transistor; and a ninth transistor having a gate electrically connected to the fourth node, and electrically connected between the other end of the eighth transistor and the second power supply line.

11. The device of claim 10, wherein each of the first, fourth, fifth, and ninth transistors is an n-type transistor, and each of the second, seventh, and eighth transistors is a p-type transistor.

12. The device of claim 9, wherein each of the first, fourth, and fifth transistors is an n-type transistor, and the second transistor is a p-type transistor.

13. The device of claim 1, wherein the first transistor is an n-type transistor, and the second transistor is a p-type transistor.

14. The device of claim 1, wherein the inverter circuit comprises a plurality of inverters connected in series between the second node and the output terminal.

15. The device of claim 14, wherein an inverter among the plurality of inverters connected to the second node is a Schmitt inverter.

16. The device of claim 1, wherein the second node is configured to transmit a signal having a logic same as a logic of an input signal input to the input terminal to the inverter circuit.

* * * * *